(12) United States Patent
Chen

(10) Patent No.: US 8,980,659 B1
(45) Date of Patent: Mar. 17, 2015

(54) LED PACKAGE AND MANUFACTURING PROCESS OF SAME

(71) Applicant: Lingsen Precision Industries, Ltd, Taichung (TW)

(72) Inventor: Wei-Jen Chen, Taichung (TW)

(73) Assignee: Lingsen Precision Industries, Ltd., Taichung (TW)

( * ) Notice: Subject to any disclaimer, the term of this patent is extended or adjusted under 35 U.S.C. 154(b) by 0 days.

(21) Appl. No.: 14/072,245

(22) Filed: Nov. 5, 2013

(30) Foreign Application Priority Data

Sep. 10, 2013 (TW) .............................. 102132666 A

(51) Int. Cl.
| | |
|---|---|
| *H01L 33/38* | (2010.01) |
| *H01L 33/48* | (2010.01) |
| *H01L 33/56* | (2010.01) |
| *H01L 33/50* | (2010.01) |
| *H01L 33/62* | (2010.01) |

(52) U.S. Cl.
CPC .............. *H01L 33/56* (2013.01); *H01L 33/502* (2013.01); *H01L 33/62* (2013.01)
USPC .............................................. 438/26; 438/29

(58) Field of Classification Search
CPC . H01L 33/60; H01L 33/62; H01L 2023/4031; H01L 33/48; H01L 2223/54486
USPC ........... 257/79, 81, 84, 98, 99, 678, 690, 779; 438/26, 29
See application file for complete search history.

(56) References Cited

U.S. PATENT DOCUMENTS

2003/0168254 A1* 9/2003 Kariya et al. ................. 174/261
2010/0096659 A1* 4/2010 Noma ............................. 257/99

FOREIGN PATENT DOCUMENTS

TW 201013858 A 4/2010

OTHER PUBLICATIONS

Eiger et al. "High power LED subassemblies for automotive front light application." 2012 IEEE 62nd Electronic Components and Technology Conference (ECTC). May 29, 2012-Jun. 1, 2012. pp. 176-181.*

* cited by examiner

*Primary Examiner* — Mohammad Islam
*Assistant Examiner* — Mikka Liu
(74) *Attorney, Agent, or Firm* — Muncy, Geissler, Olds & Lowe, P.C.

(57) ABSTRACT

A LED package is formed of a substrate, an LED chip, an insulated layer, and a fluorescent adhesive layer. The substrate includes a positive contact and a negative contact. The LED chip is fixed to the substrate and includes a positive terminal and a negative terminal, the former of which is electrically connected with the positive contact and latter is electrically connected with the negative contact. The insulated layer is mounted to the surface of the substrate and surrounds the LED chip. The fluorescent adhesive layer is mounted to a surface of the insulated layer and covers the LED chip. In this way, the LED package can reduce the production cost and the whole size.

5 Claims, 3 Drawing Sheets

LED PACKAGE AND MANUFACTURING PROCESS OF SAME

BACKGROUND OF THE INVENTION

1. Field of the Invention

The present invention relates generally to a light-emitting diode (LED) and more particularly, to an LED package and its manufacturing process.

2. Description of the Related Art

A conventional manufacturing process of an LED package is to fasten an LED chip to a substrate, then to connect multiple wires to between the LED chip and the substrate by wire bonding, and finally to package the LED chip via an encapsulating member (e.g. epoxy resin). However, such package fails to effectively reduce the whole thickness because of the connection of the wires and the requirement for circuit conduction, thus leading to insufficient competitively in the market while it is applied to the products.

To eliminate the aforesaid problem, Taiwan Patent Laid-open No, 20103858 disclosed that LED chips are mounted inside two substrates superposed on each other, and a single-sided or double-sided redistribution layer (RDL) is available, thus reducing the thickness of the whole package. However, the manufacturing process of this package is quite complicated and the effect of thickness reduction is actually limited, so it fails to indeed decrease the production cost and the thickness of the package.

SUMMARY OF THE INVENTION

The primary objective of the present invention is to provide an LED package capable of decreasing production cost and package thickness.

The foregoing objective of the present invention is attained by the LED package formed of a substrate, an LED chip, an insulated layer, and a fluorescent adhesive layer. The substrate includes a positive contact and a negative contact, both of which are located at the same side thereof. The LED chip is located on the substrate and includes a positive terminal and a negative terminal, the former of which is electrically connected with the positive contact and latter is electrically connected with the negative contact. The insulated layer is mounted to the substrate and surrounds the LED chip. The fluorescent adhesive layer is mounted to a surface of the insulated layer and covers the LED chip.

The secondary objective of the present invention is to provide a manufacturing process of the LED package that can be effectively simplified.

The foregoing objective of the present invention is attained by the manufacturing process including the steps of forming a cavity on a surface of the substrate; forming a solder mask layer on the surface of the substrate, the solder mask layer having such a first opening for exposing the cavity and a negative contact zone adjacent to the cavity; electroplating an electrically-conductive layer to the negative contact zone; removing the solder mask layer; forming an insulated layer on the surface of the substrate, the insulated layer having a second opening for exposing the cavity, the electrically-conductive layer, and a positive contact zone adjacent to the cavity; electroplating two solder layers to the positive contact zone and a surface of the electrically-conductive layer, respectively, to make the two solder layers become the positive contact and the negative contact, respectively; fastening the LED chip to the substrate via electrically-conductive adhesive mounted inside the cavity and making; hot-pressing the LED chip to melt the two solder layers to further fasten the positive and negative terminals of the LED chip to the positive and negative contacts; and dispose the fluorescent adhesive layer to the surface of the insulated layer to make the fluorescent adhesive layer cover the LED chip.

In light of the above, the manufacturing process of the LED chip of the present invention can be completed with one single substrate, so compared with the conventional manufacturing process, the present invention can effectively reduce more production cost and more package size.

DETAILED DESCRIPTION OF PREFERRED EMBODIMENTS

Structural features and desired effects of the present invention will become more fully understood by reference to two preferred embodiments given hereunder. However, it is to be understood that these embodiments are given by way of illustration only, thus are not limitative of the claim scope of the present invention.

Figure 1:
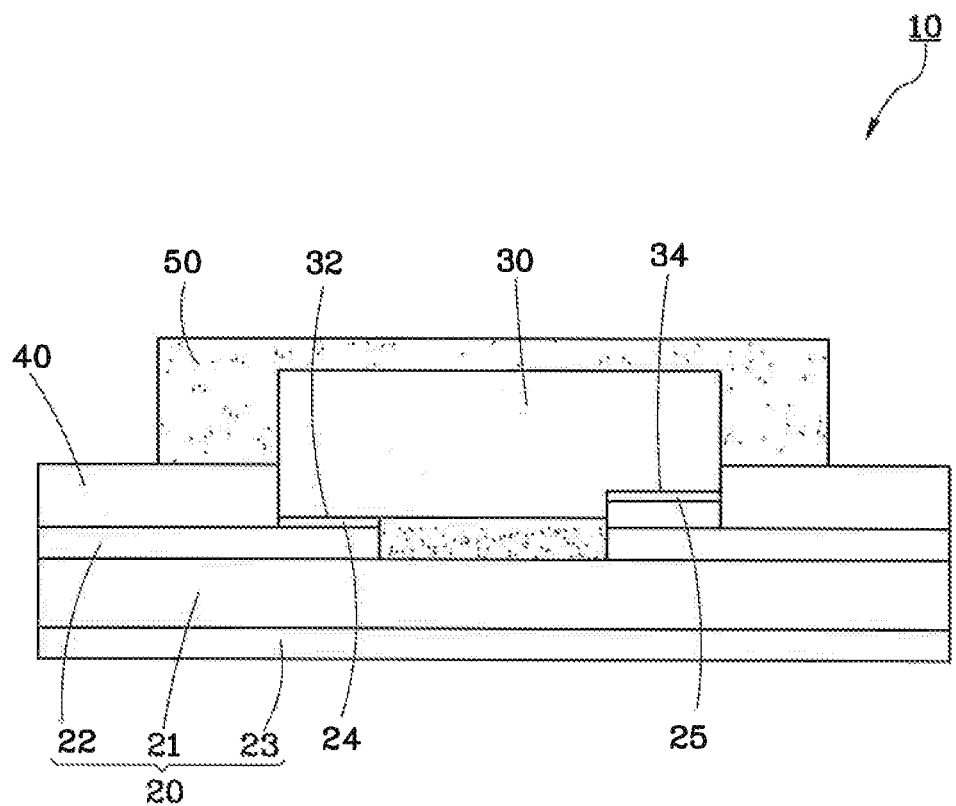
FIG. 1 is a structural schematic view of a first preferred embodiment of the present invention.

Referring to FIG. 1, an LED package 10 constructed according to a first preferred embodiment of the present invention is formed of a substrate 20, an LED chip 30, an insulated layer 40, and a fluorescent adhesive layer 50. The detailed descriptions and operations of these elements as well as their interrelations are recited in the respective paragraphs as follows.

The substrate 20 includes a fiber prepreg 21, a first metallic layer 22, and a second metallic layer 23 in this preferred embodiment. The fiber prepreg 21 is made of a composite material formed of glass fiber and epoxy resin. The first and second metallic layers 22 and 23, each of which is made of a copper foil as an example, are adhered to a front side and a rear side of the fiber prepreg 21, respectively. The substrate 20 further includes a positive contact 24 and a negative contact 25. The positive and negative contacts 24 and 25 are mounted to a surface of the first metallic layer 22 to be located on the same side of the substrate 20.

The LED chip 30 is fixed to the surface of the first metallic layer 22 and includes a positive terminal 32 and a negative terminal 34. The positive terminal 32 is electrically connected with the positive contact 24 of the substrate 20 and the negative terminal 34 is electrically connected with the negative contact 25 of the substrate 20.

The insulated layer 40 is disposed on the surface of the first metallic layer 22 and surrounds the LED chip 30 for providing protection of insulation for the positive and negative contacts 24 and 25 of the substrate 20 and the positive and negative terminals 32 and 34 of the LED chip 30. It is worth mentioning that the insulated layer 40 is preferably white in color to prevent the insulated layer 40 from absorbing rays generated by the LED chip 30 to further prevent the absorption of the rays from adversely affecting the illumination.

The fluorescent adhesive layer 50 is mounted to a surface of the insulated layer 40 and covers the LED chip 30 for enhancing the luminous efficiency of the LED chip 30. The fluorescent adhesive layer 40 is made of epoxy resin and fluorescent power.

Figure 2:
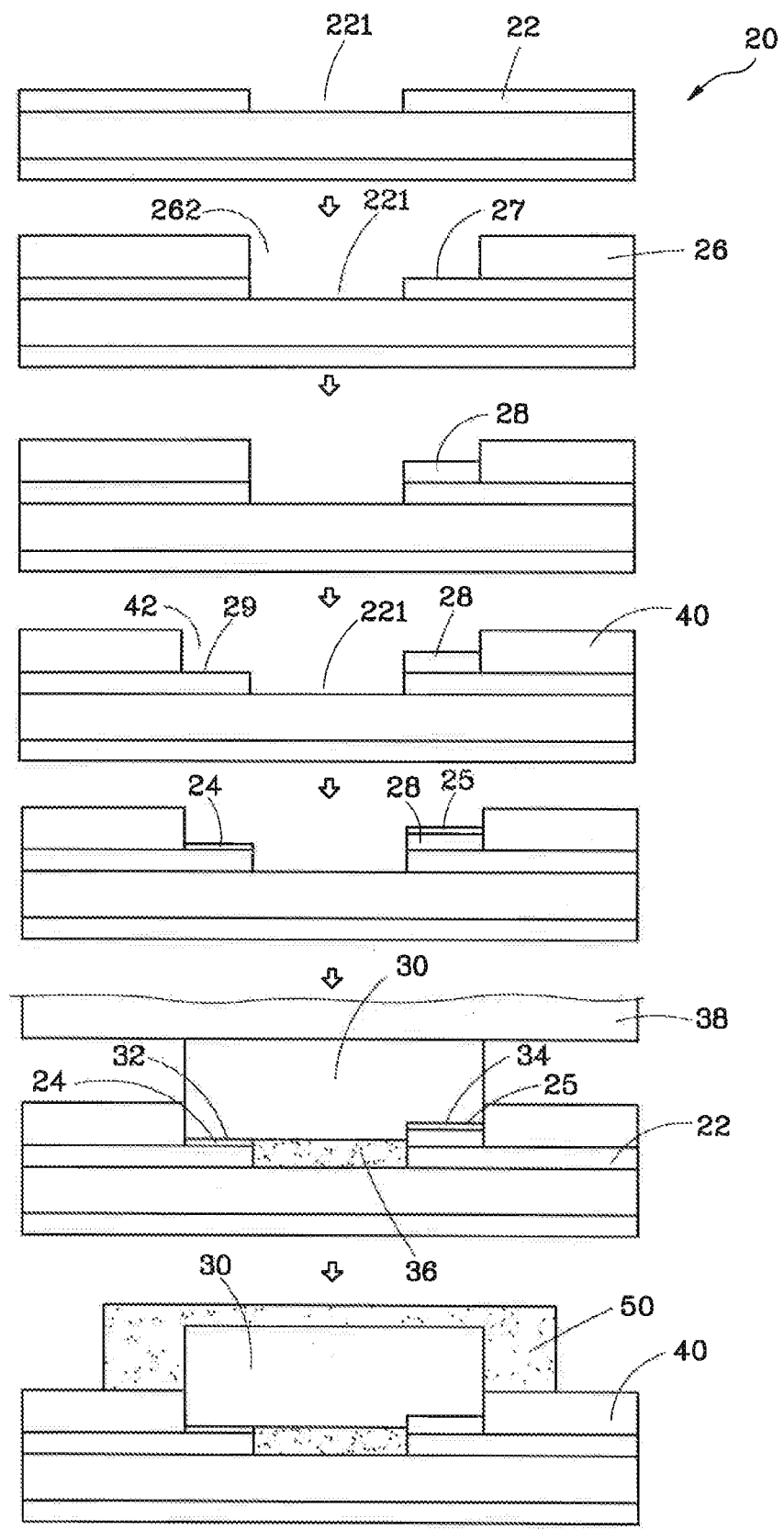
FIG. 2 is a flow chart of the first preferred embodiment of the present invention.

Referring to FIG. 2, a manufacturing process of the LED package 10 includes the following steps.

S1: Etch the surface of the first metallic layer 22 of the substrate 20 to form a cavity 221.

S2: Coat a solder mask layer 26 onto the surface of the first metallic layer 22 and make a first opening 262 on the solder mask layer 26 for exposing the cavity 221 and a negative contact zone 27 adjacent to the cavity 221 from the first opening 262.

S3: Electroplate an electrically-conductive layer 28, which is preferably made of copper, to the negative contact zone 27.

S4: Remove the solder mask layer 26.

S5: Coat an insulated layer 40 onto the surface of the first metallic layer 22 and make a second opening on the insulated layer 40 for exposing the cavity 221, the electrically-conductive layer 28, and a positive contact zone 29 adjacent to the cavity 221 from the second opening 42.

S6: Electroplate two solder layers, each of which is preferably made of tin-lead alloy, to surfaces of the positive contact zone 29 and the electrically-conductive layer 28, respectively to make the two solder layers become the positive contact 24 and the negative contact 25 of the substrate 20.

S7: Mount electrically-conductive adhesive 36, e.g. silver paste, into the cavity 221 of the substrate 20, fasten the LED chip 30 to the surface of the first metallic layer 22 via the electrically-conductive adhesive 36, and make the positive and negative terminals 32 and 34 adhesively connected with the two solder mask layers, respectively.

S8: Hot-press the LED chip 30 via a hot-pressing member 38 to melt the solder mask layers to make the positive terminal 32 fixedly connected with the positive contact 24 and make the negative terminal 34 fixedly connected with the negative contact 25 to further complete the electrical connection between the LED chip 30 and the substrate 20.

S9: Coat a fluorescent adhesive layer 50 to the surface of the insulated layer 40 and make the fluorescent adhesive layer 50 cover LED chip 30.

In light of the steps mentioned above, the package of the LED chip 30 of the present invention can be completed with one single substrate 20. Compared with the conventional wire bonding or the conventional layout of the two superposed substrates and the RDL, the LED package 10 of the present invention not only has the relatively simpler process but reduces the production cost and the package size.

Figure 3:
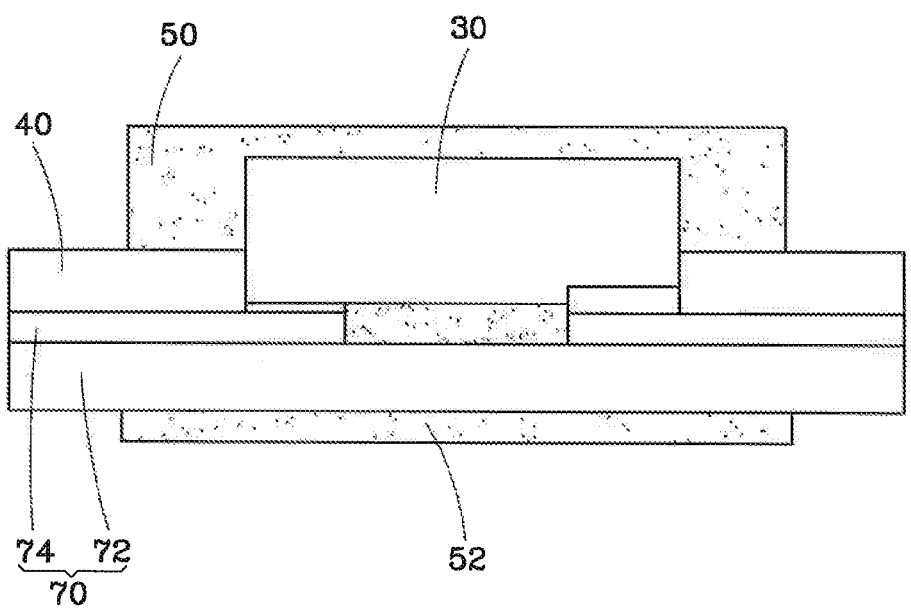
FIG. 3 is a structural schematic view of a second preferred embodiment of the present invention.

Referring to FIG. 3, an LED package 60 constructed according to a second preferred embodiment of the present invention is similar to that of the first preferred embodiment of the present invention, having the primary difference lying in that the substrate 70 of the second preferred embodiment is structurally different from that of the first preferred embodiment. Specifically, the substrate 70 includes a transparent layer 72 preferably made of polyethylene terephthalate (PET). A metallic layer 74, which is made of a copper foil, is adhered to a front side of the transparent layer 72. An insulated layer 40 is coated onto a surface of the metallic layer 74. A fluorescent adhesive layer 50 is coated to a surface of the insulated layer 40. Another fluorescent adhesive layer 52 is coated to a rear side of the transparent layer 72 and made of epoxy resin and fluorescent powder for make the rays of the LED chip 30 emitted through front and rear sides of the substrate 70. Since the manufacturing process of the LED package 70 further includes a step of coating the fluorescent adhesive layer 52 to the rear aside of the transparent layer 74 and the other steps are identical to those of the first preferred embodiment, detailed recitation of the manufacturing process of the second preferred embodiment is skipped.

In conclusion, the LED package 60 includes the effect of double-sided illumination based on the transparent layer 72 and the two fluorescent adhesive layers 50 and 52 as well as the effects of reduced production cost and decreased package thickness.

What is claimed is:

1. A manufacturing process of an LED package comprises steps of:
    S1: Forming a cavity on a surface of a substrate;
    S2: Forming a solder mask layer on the surface of the substrate, the solder mask layer having a first opening for exposing the cavity and a negative contact zone adjacent to the cavity;
    S3: Electroplating an electrically-conductive layer to the negative contact zone;
    S4: Removing the solder mask layer;
    S5: Forming an insulated layer on the surface of the substrate, the insulated layer having a second opening for exposing the cavity, the electrically-conductive layer, and a positive contact zone adjacent to the cavity;
    S6: Electroplating a solder layer to the positive contact zone and a surface of the electrically-conductive layer;
    S7: Fastening an LED chip to the substrate via an electrically-conductive adhesive mounted inside the cavity and adhering a positive terminal and a negative terminal of the LED chip to the two solder layers, respectively;
    S8: Hot-pressing the LED chip to melt the two solder layers to further fasten the positive and negative terminals of the LED chip to the two solder layers; and
    S9: Forming a fluorescent layer on a surface of the insulated layer and make the fluorescent layer cover the LED chip.

2. The manufacturing process as defined in claim 1, wherein the substrate comprises a fiber prepreg, a first metallic layer, and a second metallic layer, the fiber prepreg having a front side and a rear side, the first and second metallic layers being mounted to the front and rear sides of the fiber prepreg; in the step S1, the cavity is formed by etching a surface of the first metallic layer.

3. The manufacturing process as defined in claim 1, wherein the substrate comprises a transparent layer and a metallic layer, the transparent layer having a front side and a rear side, the metallic layer being mounted to the front side of the transparent layer; in the step S1, the cavity is formed by etching a surface of the metallic layer.

4. The manufacturing process as defined in claim 3, wherein the step S9 further comprises a sub-step of disposing a fluorescent layer onto the rear side of the transparent layer.

5. The manufacturing process as defined in claim 1, wherein the insulated layer in the step S5 is white in color.

* * * * *